(12) United States Patent
Furukawa et al.

(10) Patent No.: US 6,184,549 B1
(45) Date of Patent: Feb. 6, 2001

(54) TRENCH STORAGE DYNAMIC RANDOM ACCESS MEMORY CELL WITH VERTICAL TRANSFER DEVICE

(75) Inventors: Toshiharu Furukawa, Essex Junction; Mark C. Hakey, Milton; David V. Horak, Essex Junction, all of VT (US); William H. Ma, Fishkill; Jack A. Mandelman, Stormville, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/296,807

(22) Filed: Apr. 23, 1999

Related U.S. Application Data (62) Division of application No. 09/086,057, filed on May 28, 1998.

(51) Int. Cl.[7] .................................................. H01L 27/108
(52) U.S. Cl. ........................ 257/302; 257/301; 438/242
(58) Field of Search ..................................... 257/301, 302, 257/304, 305; 438/242, 243, 268, 151

(56) References Cited

U.S. PATENT DOCUMENTS

| | | | |
|---|---|---|---|
| 4,462,040 | 7/1984 | Ho et al. ................................ | 257/302 |
| 4,630,088 | 12/1986 | Ogura et al. ......................... | 257/911 |
| 4,797,373 * | 1/1989 | Malhi et al. .......................... | 438/249 |
| 4,801,988 | 1/1989 | Kenney ................................. | 257/304 |
| 4,873,560 * | 10/1989 | Sunami et al. ....................... | 357/23.6 |
| 4,894,697 | 1/1990 | Chin et al. ............................ | 257/302 |
| 4,920,065 | 4/1990 | Chin et al. ............................ | 257/302 |
| 4,939,104 * | 7/1990 | Pallack et al. ....................... | 438/561 |
| 4,941,026 | 7/1990 | Temple ................................. | 257/333 |
| 4,977,436 | 12/1990 | Tsuchiya et al. .................... | 257/302 |
| 5,001,526 | 3/1991 | Gotou ................................... | 257/305 |
| 5,071,782 | 12/1991 | Mori ..................................... | 257/315 |
| 5,073,519 | 12/1991 | Roddler ................................ | 257/386 |
| 5,177,027 | 1/1993 | Lowrey et al. ....................... | 438/270 |
| 5,185,646 | 2/1993 | Mizuno ................................. | 257/390 |
| 5,198,383 | 3/1993 | Teng et al. ............................ | 438/246 |
| 5,208,657 * | 5/1993 | Chatterjee et al. .................. | 257/302 |
| 5,231,037 | 7/1993 | Yuan et al. ........................... | 438/193 |
| 5,324,673 | 6/1994 | Fitch et al. ........................... | 438/156 |
| 5,350,708 | 9/1994 | Yagishita et al. .................... | 438/248 |
| 5,362,665 | 11/1994 | Lu ......................................... | 438/253 |
| 5,414,288 | 5/1995 | Fitch et al. ........................... | 257/328 |
| 5,480,838 | 1/1996 | Mitsui .................................. | 438/270 |
| 5,504,359 | 4/1996 | Roddler ................................ | 257/329 |
| 5,519,236 * | 5/1996 | Ozaki ................................... | 257/302 |
| 5,831,301 * | 11/1998 | Horak et al. ......................... | 257/302 |
| 5,959,325 * | 9/1999 | Adair et al. .......................... | 257/302 |

FOREIGN PATENT DOCUMENTS 8-64810 3/1996 (JP) .

OTHER PUBLICATIONS

W.F.Richardson, et al.; A Trench Transistor Cross–Point DRAM Cell; IEDM, CH2252–5/85, 0000–0714, 1985; pp. 714–717.

B. Wu; Pillar DRAM Cell with Dual Channels and an Underneath Trench–in–Trench Capacitor Built on SOI Structure; IBM Technical Disclosure Bulletin, vol. 36 No. 11.

S. Nakajima et al; A Trench MOSFET with Surface Source/Drain Contrcts;IEDM;CH2252–5/85/000–0200;1985;pp. 200–203.

* cited by examiner

*Primary Examiner*—Carl Whitehead, Jr.
*Assistant Examiner*—Jeff Vockrodt
(74) *Attorney, Agent, or Firm*—McGuireWoods LLP; Howard J. Walter, Jr.

(57) ABSTRACT

A trench storage dynamic random access memory cell with vertical transfer device can be formed in a wafer having prepared shallow trench isolation. Vertical transfer device is built as the deep trenches are formed. Using square printing to form shallow trench isolation and deep trenches, allows for scaling of the cell to very small dimensions.

2 Claims, 6 Drawing Sheets

TRENCH STORAGE DYNAMIC RANDOM ACCESS MEMORY CELL WITH VERTICAL TRANSFER DEVICE

CROSS-REFERENCE TO RELATED APPLICATIONS

This application is a divisional application of U.S. patent application Ser. No. 09/086,057 filed May 28, 1998, and the complete contents of that application are herein incorporated by reference.

BACKGROUND OF THE INVENTION

1. Field of the Invention

The present invention generally relates to integrated circuit dynamic random access memories, and more particularly to trench capacitor construction.

2. Background Description

As dynamic random access memory (DRAM) cells are scaled to meet chip-size requirements for future generations, the channel length of transfer devices on the surface of the silicon substrate can no longer be scaled without degrading subthreshold leakage requirements (or retention time requirements). Process steps become complex and incompatible with standard DRAM processes, when vertical transfer devices in the DRAM cell are employed to decouple the channel length from layout ground rules.

SUMMARY OF THE INVENTION

It is therefore an object of the present invention to provide a vertical transfer device which is built on top of a deep trench storage node and is compatible with contemporary DRAM process steps.

By integrating a robust transfer device in a Dynamic Random Access Memory (DRAM) cell having a shallow trench isolation (STI) region constructed between adjacent trench capacitor cells, having the transfer device region bound by shallow trench isolation oxide, the device channel length requirement is independent of the cell size. As an example, the inventive process may use a 256 Mb DRAM cell with 0.25 µm ground rules. The process is also applicable to other ground rules. The structures formed in the inventive process are most useful as ground rules are reduced and DRAM density is increased. The horizontal layout allows the product to be scaled with changing ground rules.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
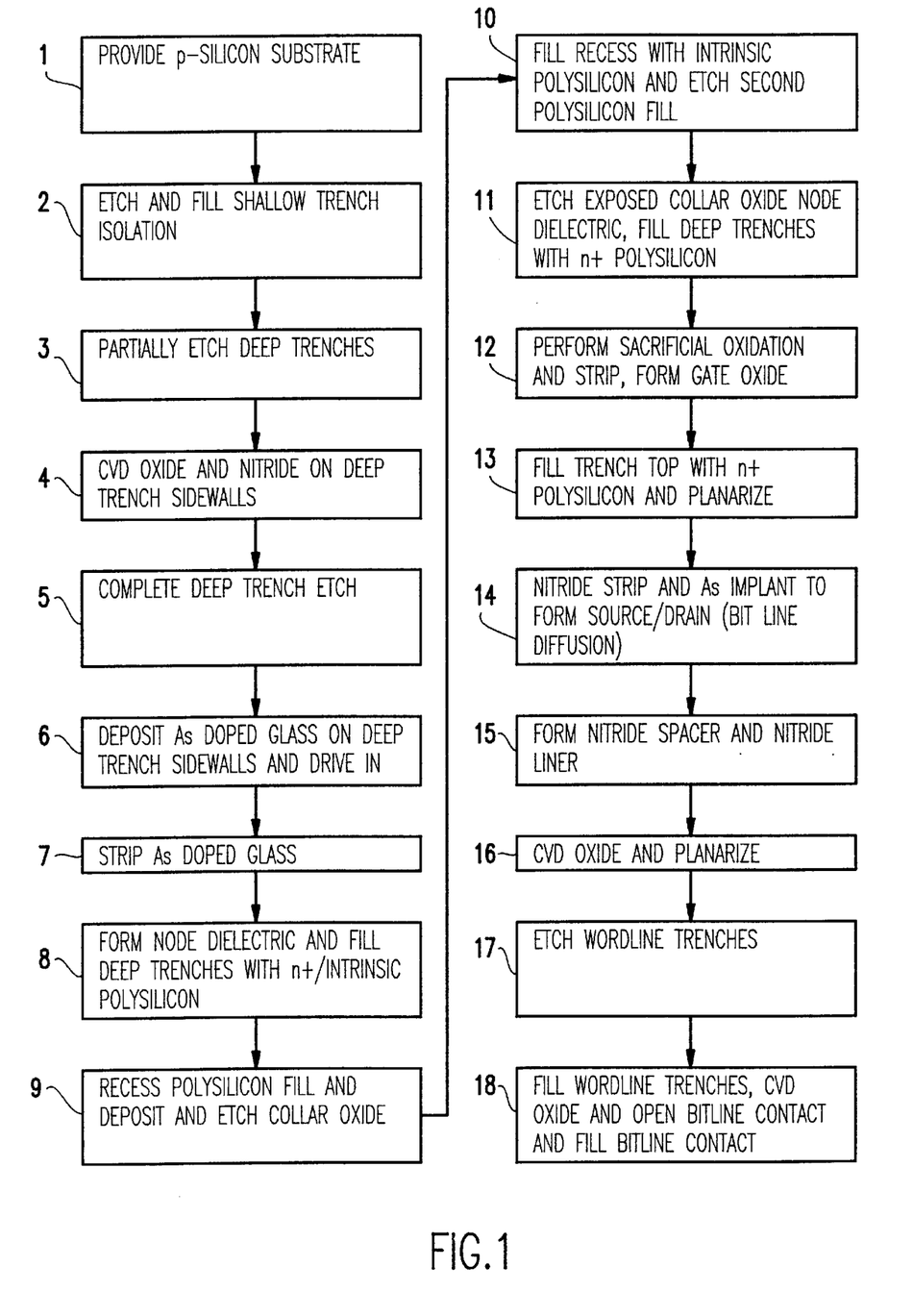
FIG. 1 is a flow chart of the inventive method.

Referring now to the drawings, and more particularly to FIG. 1, there is shown a flow chart of the inventive process. First, as shown in the step in block 1, a p-type silicon substrate is provided. This substrate will typically be comprised of 1–2 Ω-cm boron doped <100> silicon and have pad oxide and pad nitride layers. As shown in the step in block 2, trenches for shallow trench isolation (STI) are etched and filled with $SiO_2$.

Then, as shown in the step in block 3, deep trenches are partially etched to a depth which extends below the STI. Next, as shown in the step in block 4, CVD oxide and nitride are deposited on the deep trench sidewalls. This deposition will act as an arsenic diffusion mask and also as a mask for arsenic doped glass strip.

In the step shown in block 5, the deep trench etching is completed to the full depth of the deep trench. Then, as shown in the step in block 6, arsenic doped glass is deposited on deep trench sidewalls and the deep trenches are doped by a thermal drive in. This forms the n+ buried plate. Then, as shown in the step in block 7, the arsenic doped glass is stripped. The glass used may contain other n type dopants such as phosphorous or antimony. Arsenic is the preferred dopant because it diffuses slowly, thus, providing more control in forming the n+ buried plate.

Next as shown in the step in block 8, a standard nitride/oxide node dielectric is formed and the deep trench is filled by n+ or intrinsic multi layer polysilicon. As shown in the step in block 9, this fill is recessed and a collar oxide is deposited. The design dimension is set such that parasitic conduction does not occur between the buried strap diffusion and the buried plate. As shown in the step in block 10, the deep trench is again filled with intrinsic polysilicon, planarized and recessed. The distance between the first and second recesses is set by the channel length requirement of the vertical MOSFET. Typically, the range is between 0.7 and 1.0 µm. Then, as shown in the step in block 11, the exposed collar oxide and nitride/oxide node dielectric are etched. The recess is then filled with intrinsic or n-type polysilicon followed by planarization and recess. This third recess may typically be 0.5 µm from the top of the silicon surface.

Next, as shown in the step in block 12, gate oxide is formed on deep trench side walls after a sacrificial oxidation and strip. Then, as shown in the step in block 13, the trench top is filled with n+ polysilicon and planarized. The n+ polysilicon forms the gate of the transfer device.

In the step shown in block 14, nitride is stripped from the top of the p-substrate next to the transfer device and arsenic is implanted for the bit line diffusion of the transfer device. Any other n type dopant may be used in place of arsenic for forming bit line diffusion. This step could be performed earlier in the process.

Then, as shown in the step in block 15, a nitride spacer is formed on the side wall of the n+ polysilicon gate to prevent word line falling into the bit line diffusion area and also to prevent bit line contact from falling too close to the n+ polysilicon gate a nitride liner is then deposited. Next, as shown in the step in block 16, CVD oxide is deposited and planarized.

Then, as shown in the step in block 17, word line trenches are etched in the CVD oxide to the top of the nitride by using a sub-lithographic technique such as spacer word line or hybrid photo resist. Nitride under the active word line is etched open while photo resist covers over passing word line trench. For open bit line architecture, only one word line goes over the gate and connects to the gate by a normal lithographic contact.

Finally, in the step shown in block 18, word line trenches are filled with conductive material such as aluminum and planarized. More CVD oxide is deposited and the bit line contact is opened. The bit line contact is filled with tungsten or n+ polysilicon or other conductive material. The bit line is formed by standard aluminum or copper M1 process.

Figure 2:
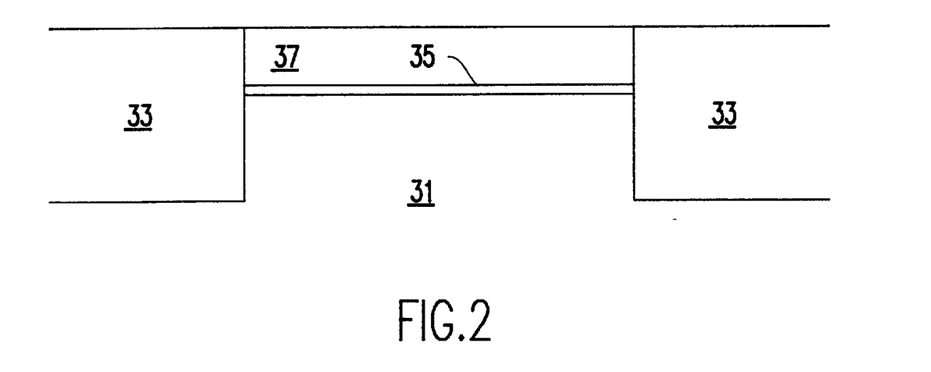
FIGS. 2 to 9 are cross sections of the inventive structure as it appears during the steps of the inventive method shown in FIG. 1.

FIG. 2 is a cross section of a substrate after the first step of the method of the present invention. The p-silicon substrate 31 has shallow trench isolation 33 and pad oxide 35 and pad nitride 37 between shallow trench isolation 33. This is how the structure would appear after the step shown in block 2 of FIG. 1.

Figure 3:
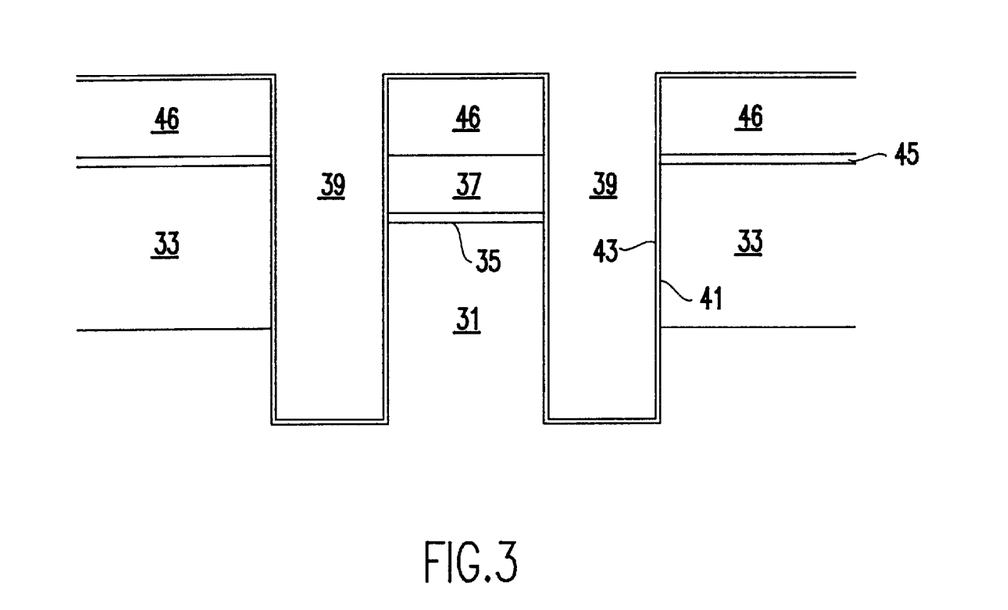

FIG. 3 shows a cross section of the structure as it would appear after the step shown in block 4 of FIG. 1. There is shown the upper portion 39 of deep trenches lined with CVD silicon dioxide 41 and nitride 43. A thin nitride layer 45 has been formed over the shallow trench isolation 33 and a CVD silicon dioxide 46 is formed over the nitride layers 45 and pad nitride 37.

Figure 4:
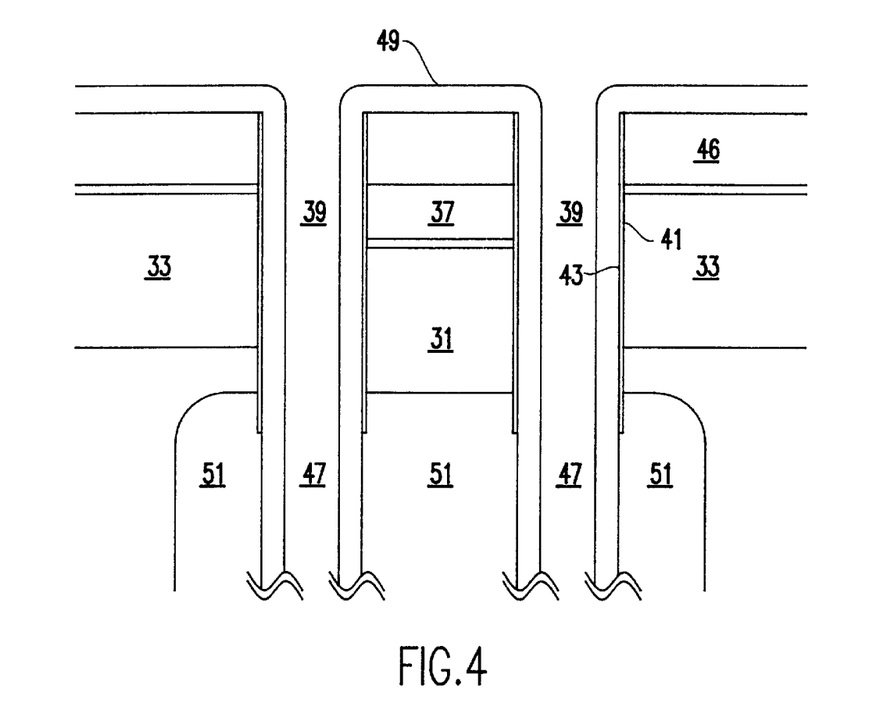

FIG. 4 shows a cross section of the structure after etching of the deep trenches has been completed. This is how the structure would appear following the step shown in block 6 in FIG. 1. As can be seen, the lower portion 47 of the deep trenches has been etched and arsenic doped glass 49 covers the structure and lines the deep trenches. An arsenic drive in forms an n+ diffusion plate 51 surrounding the lower portion 47 of the deep trenches. The CVD oxide 41 and nitride 43 lining the upper portions 39 of the deep trenches acts as a mask for arsenic diffusion.

Figure 5:
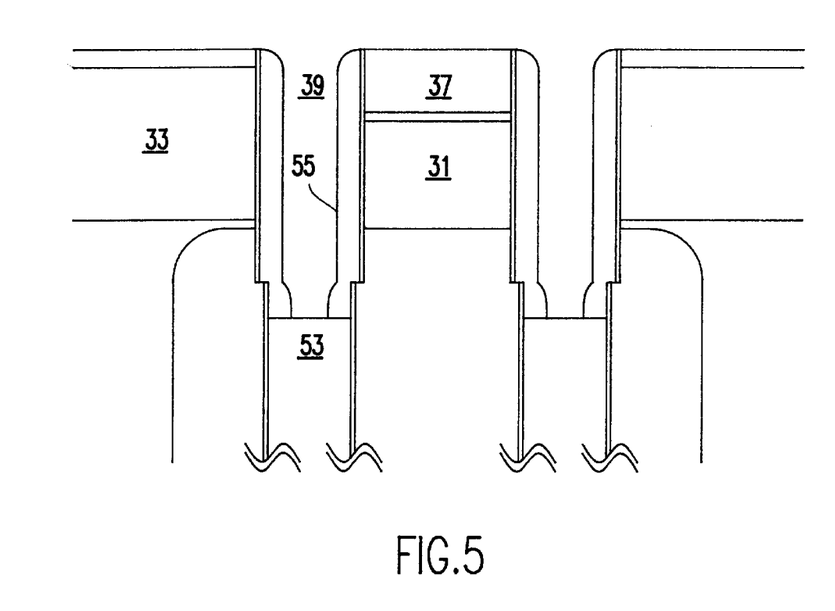

FIG. 5 shows the structure following the step shown in block 9 in FIG. 1. The arsenic doped glass has been stripped, and a node dielectric deposited. The lower portion 47 of the deep trenches has been filled with n+ polysilicon 53 and a SiO$_2$ collar 55 has been formed in the upper portion 39 of the deep trenches.

Figure 6:
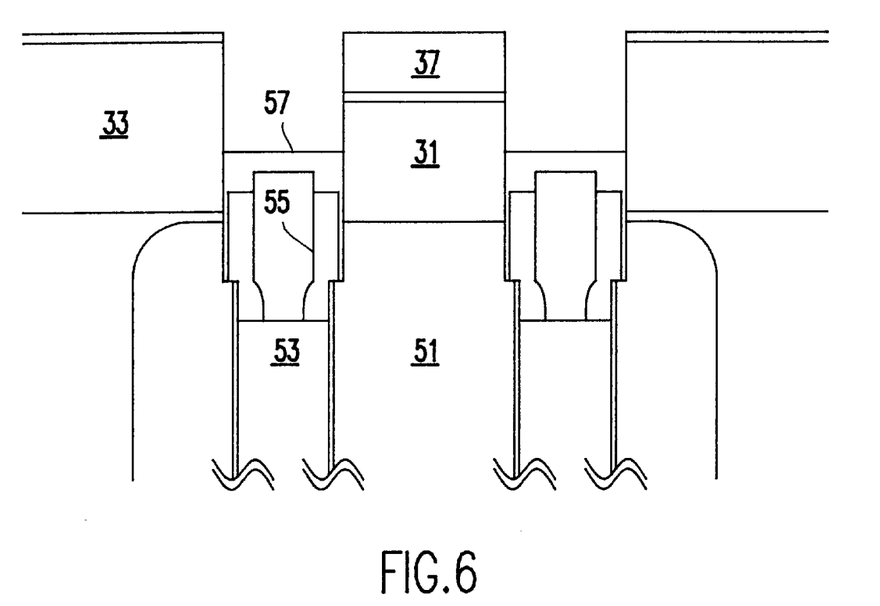

FIG. 6 shows the structure following the step shown in block 11 of FIG. 1. The upper portion 39 of the deep trenches has been filled with n+polysilicon and recessed etched. N+ polysilicon 53 now fills a part of the upper portion 39 of the deep trench. The collar 55 has been etched as well. N-type or intrinsic polysilicon fill 57 is deposited over the collar 55 and n+ polysilicon 53.

Figure 7:
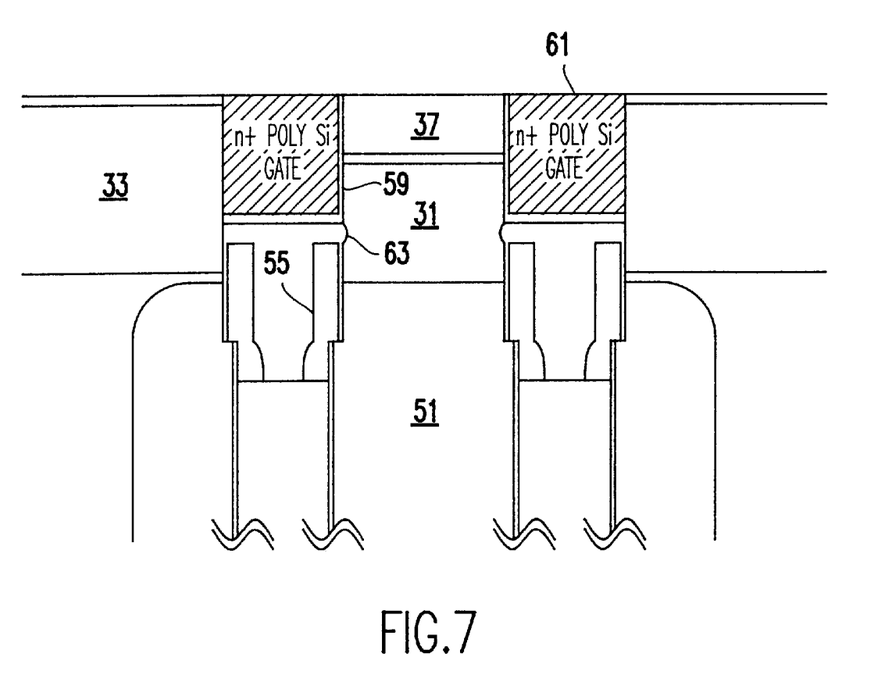

FIG. 7 shows the structure following the step shown in block 13 of FIG. 1. As can be seen in FIG. 7, gate oxide 59 is formed on the deep trench sidewall. The remaining opening in the deep trench has been filled with n+ polysilicon 61 which acts as the gate of the transfer device. Also some arsenic diffusion 63 can be seen, beginning to form the bottom n+ source/drain diffusion, referred to as the storage node strap diffusion.

Figure 8:
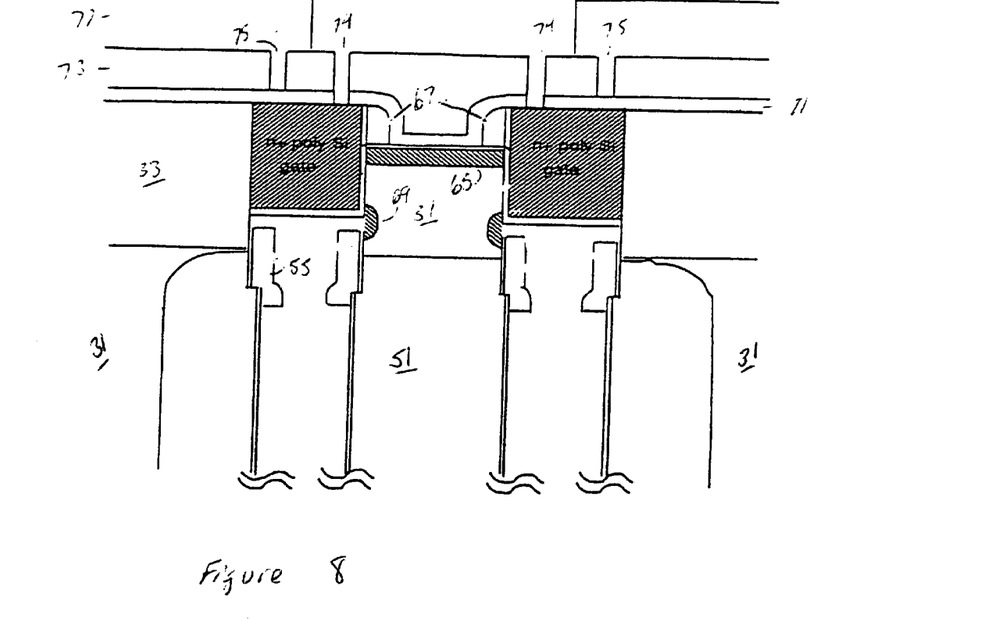

FIG. 8 shows the inventive structure as it would appear following the step shown in block 17 of FIG. 1. Here, nitride on p-silicon substrate 31 has been removed and arsenic has been implanted in the exposed surface to form the n+ diffusion 65 (bit line diffusion) for the field effect transfer device. Nitride spacers 67 have been formed. The source/drain 69 is fully formed (out diffused). A layer of nitride 71 has been deposited over the STI 33, n+ polysilicon gate 61 and n+ diffusion 65. CVD oxide 73 is deposited over nitride 71. Cell wordline trench 74 and passing wordline trenches 75 are etched in oxide 73 and a photoresist 77 covers the substrate. As can be seen cell wordlines 74 are etched through nitride 71 to contact gate polysilicon 61.

Figure 9:
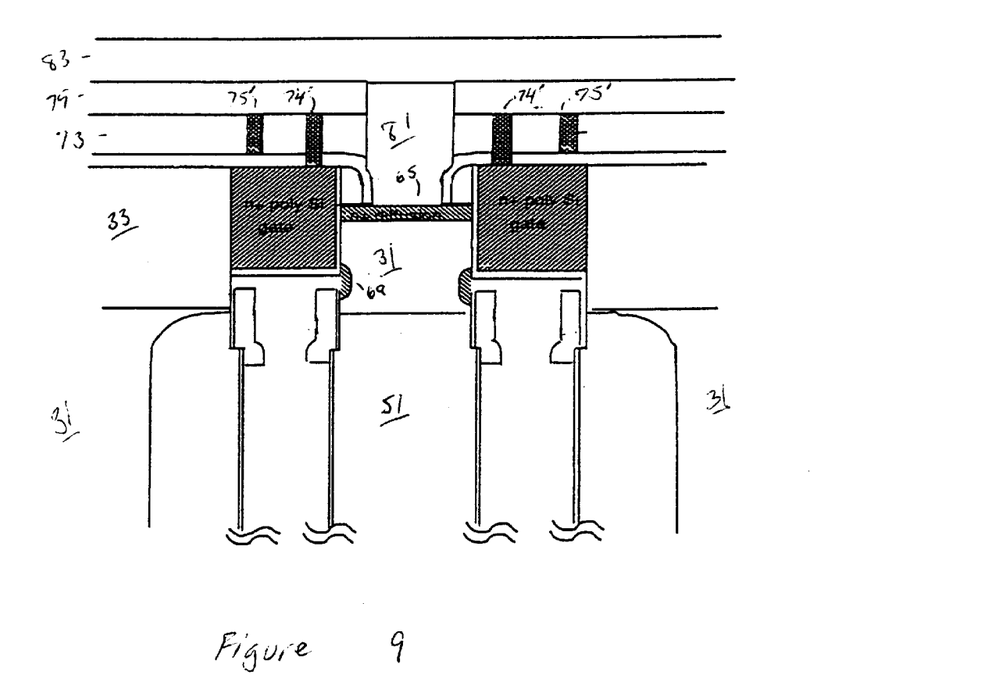

FIG. 9 there is as shown a cross section of the inventive structure, a trench storage DRAM cell with a vertical transfer device, after the final step of the process shown in FIG. 1. Wordline trenches 74 and 75 are filled with a conductive material, such as aluminum. Oxide layer 79 on oxide layer 73 covering wordline trenches 74' and 75'. The bitline contact 81 is formed connecting n+ bitline diffusion 65 with the metal bitline 83 which runs perpendicular to the wordline trenches 74' and 75' and spans the pair of bits.

Figure 10:
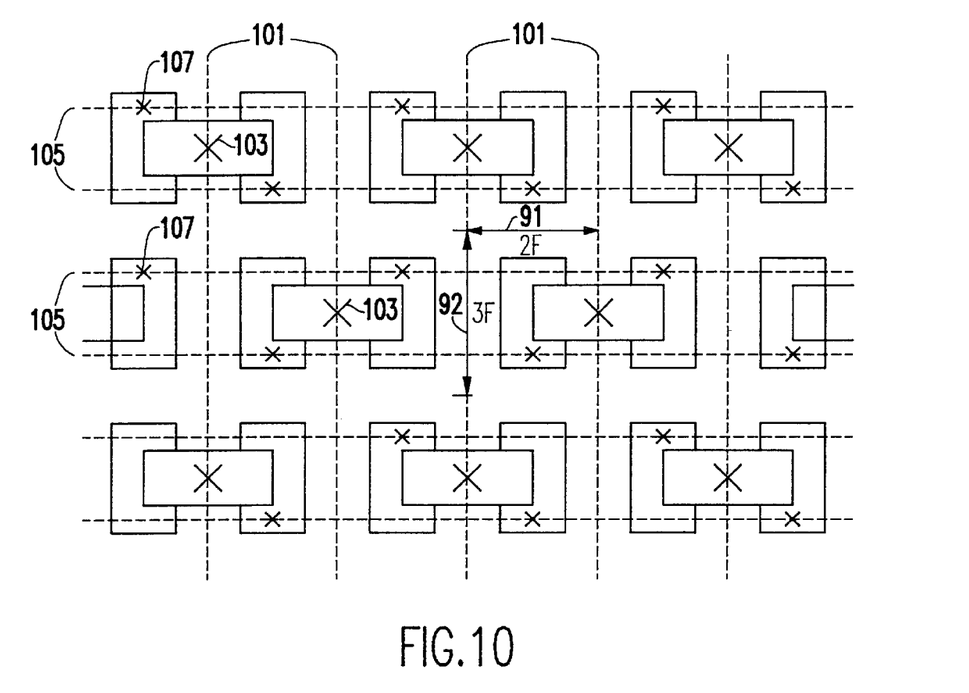
FIG. 10 is a layout of a 6 square folded bit line cell.
Figure 11:
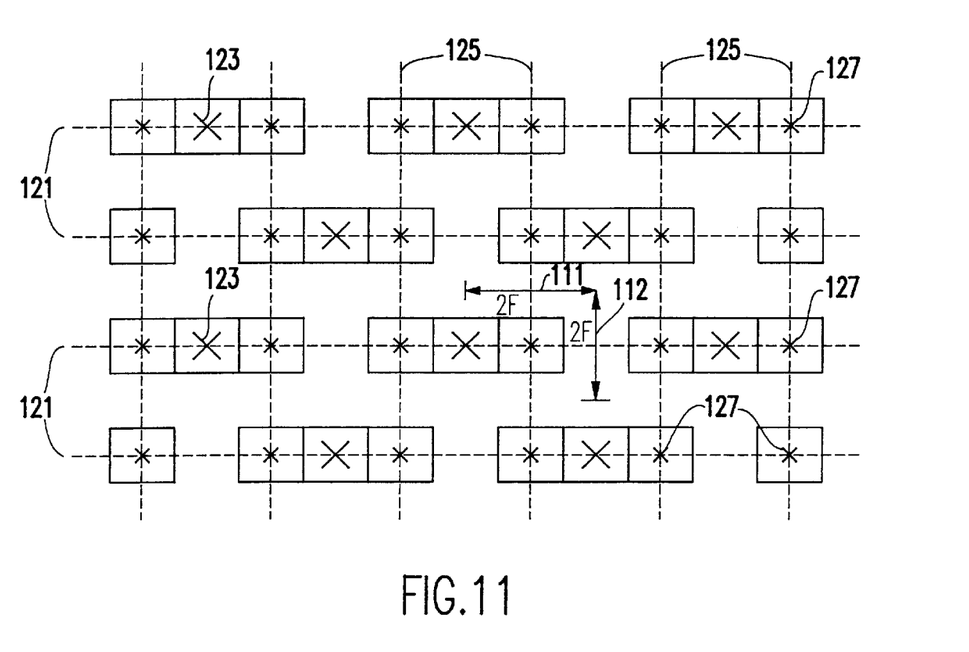
FIG. 11 is a layout of a 4 square open bit line cell.

FIGS. 10 and 11 show two possible layouts which may be used with the inventive vertical transfer device. FIG. 10 is a layout for a 6 square folded bit line cell. Each memory array is 2 feature lengths by 3 feature lengths (i.e. 6 squares), as is shown by bracketed arrows 91, 92. As can be seen each bit line of the pair 101 vertically connects one bit line contact 103 in every other row across the memory array. The word line in pair 105 connects to one word line contact 107 horizontally in each pair of the cells across the memory array.

The layout of a 4 square open bit line cell is shown in FIG. 11. Each memory array is 2 feature lengths by 2 feature lengths (i.e. 4 squares), as is shown by bracketed arrows 111, 112. In this layout each bit line pair 121 horizontally connects the bit line contacts 123 in each pair of cells across the memory array. The word line pairs 125 connect one of the pair of word line contacts 127 in each of pair of the cells vertically across the memory array. The 6 square cell offers greater noise immunity at the expense of layout area compared to the 4 square cell.

In order to create the layouts for the 6 square and 4 square cells, a method known as square printing is used. Square printing is used to etch both the deep trench and shallow trench isolation. The first step in square printing is to form one mask of parallel edged openings in etchable material. Then, a second mask of parallel edged openings is formed. The openings of the second mask are perpendicular to those printed with the first. The use of two masks overlapping creates an image with sharp corners. As a result, devices may be scaled to very small dimensions.

In another embodiment, the inventive structure may be prepared using an n type silicon substrate and p type dopants. Examples of p type dopants include boron.

While the invention has been described in terms of a single preferred embodiment, those skilled in the art will recognize that the invention can be practiced with modification within the spirit and scope of the appended claims.

We claim:

1. A trench storing dynamic random access memory cell with vertical transfer device, comprising:

deep trenches formed in a p type substrate having a lower portion partially filled with n+ polysilicon storage node electrode and surrounded by an n+ silicon storage plate;

a vertical metal oxide semiconductor field effect transistor transfer device in an upper portion of said deep trenches;

a collar isolation oxide in an upper portion of said deep trenches on a multiplicity of sidewalls of said deep trenches between an n+ buried strap diffusion of said metal oxide semiconductor field effect transistor and said n+ silicon storage plate;

a recessed polysilicon gate conductor positioned within an upper portion of said deep trenches gating a p type silicon adjacent said deep trench and connecting an n+ bit line diffusion positioned above said p type silicon and said n+ buried strap diffusion; and a multiplicity of recessed active and passing word line conductors on an insulating layer above said deep trenches.

2. A trench storing dynamic random access memory cell with vertical transfer device comprising:

deep trenches formed in an n type substrate having a lower portion partially filled with p type polysilicon storage node electrode and surrounded by a p type silicon storage plate;

a vertical metal oxide semiconductor field effect transistor device in an upper portion of said deep trenches;

a collar isolation oxide in an upper portion of said deep trenches on a multiplicity of sidewalls of said deep trenches between a p type buried strap diffusion of said metal oxide semiconductor field effect transistor and said p type silicon storage plate;

a recessed polysilicon gate conductor positioned within an upper portion of said deep trenches gating an n type silicon adjacent said deep trench and connecting a p type bit line diffusion positioned above said n type silicon and said p type buried strap diffusion; and a multiplicity of recessed active and passing word line conductors on an insulating layer above said deep trenches.

\* \* \* \* \*

UNITED STATES PATENT AND TRADEMARK OFFICE
CERTIFICATE OF CORRECTION

PATENT NO. : 6,184,549 B1
DATED : February 6, 2001
INVENTOR(S) : Toshiharu Furukawa It is certified that error appears in the above-identified patent and that said Letters Patent is hereby corrected as shown below:

Title page, should be deleted and substitute therefor the attached title page.

United States Patent
Furukawa et al.

(10) Patent No.: US 6,184,549 B1
(45) Date of Patent: Feb. 6, 2001

(54) TRENCH STORAGE DYNAMIC RANDOM ACCESS MEMORY CELL WITH VERTICAL TRANSFER DEVICE

(75) Inventors: Toshiharu Furukawa, Essex Junction; Mark C. Hakey, Milton; David V. Horak, Essex Junction, all of VT (US); William H. Ma, Fishkill; Jack A. Mandelman, Stormville, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/296,807

(22) Filed: Apr. 23, 1999

Related U.S. Application Data (62) Division of application No. 09/086,057, filed on May 28, 1998.

(51) Int. Cl.$^7$ .................................................. H01L 27/108
(52) U.S. Cl. ........................... 257/302; 257/301; 438/242
(58) Field of Search ................................ 257/301, 302, 257/304, 305; 438/242, 243, 268, 151

(56) References Cited

U.S. PATENT DOCUMENTS

| | | | |
|---|---|---|---|
| 4,462,040 | 7/1984 | Ho et al. | 257/302 |
| 4,630,088 | 12/1986 | Ogura et al. | 257/911 |
| 4,797,373 * | 1/1989 | Malhi et al. | 438/249 |
| 4,801,988 | 1/1989 | Kenney | 257/304 |
| 4,873,560 * | 10/1989 | Sunami et al. | 357/23.6 |
| 4,894,697 | 1/1990 | Chin et al. | 257/302 |
| 4,920,065 | 4/1990 | Chin et al. | 257/302 |
| 4,939,104 * | 7/1990 | Pollack et al. | 438/561 |
| 4,941,026 | 7/1990 | Temple | 257/333 |
| 4,977,436 | 12/1990 | Tsuchiya et al. | 257/302 |
| 5,001,526 | 3/1991 | Gotou | 257/305 |
| 5,071,782 | 12/1991 | Mori | 257/315 |
| 5,073,519 | 12/1991 | Rodder | 257/386 |
| 5,177,027 | 1/1993 | Lowrey et al. | 438/270 |
| 5,185,646 | 2/1993 | Mizuno | 257/390 |
| 5,198,383 | 3/1993 | Teng et al. | 438/246 |
| 5,208,657 * | 5/1993 | Chatterjee et al. | 257/302 |
| 5,231,037 | 7/1993 | Yuan et al. | 438/193 |
| 5,324,673 | 6/1994 | Fitch et al. | 438/156 |
| 5,350,708 | 9/1994 | Yagishita et al. | 438/248 |
| 5,362,665 | 11/1994 | Lu | 438/253 |
| 5,414,288 | 5/1995 | Fitch et al. | 257/328 |
| 5,480,838 | 1/1996 | Mitsui | 438/270 |
| 5,504,359 | 4/1996 | Rodder | 257/329 |
| 5,519,236 * | 5/1996 | Ozaki | 257/302 |
| 5,831,301 * | 11/1998 | Horak et al. | 257/302 |
| 5,959,325 * | 9/1999 | Adair et al. | 257/302 |

FOREIGN PATENT DOCUMENTS 8-64810   3/1996   (JP).

OTHER PUBLICATIONS

W.F.Richardson, et al.; A Trench Transistor Cross–Point DRAM Cell; IEDM, CH2252–5/85, 0000–0714, 1985; pp. 714–717.

B. Wu; Pillar DRAM Cell with Dual Channels and an Underneath Trench–in–Trench Capacitor Built on SOI Structure; IBM Technical Disclosure Bulletin, vol. 36 No. 11.

S. Nakajima et al; A Trench MOSFET with Surface Source/Drain Contrcts;IEDM;CH2252–5/85/000–0200;1985;pp. 200–203.

* cited by examiner

Primary Examiner—Carl Whitehead, Jr.
Assistant Examiner—Jeff Vockrodt
(74) Attorney, Agent, or Firm—McGuireWoods LLP; Howard J. Walter, Jr.

(57) ABSTRACT

A trench storage dynamic random access memory cell with vertical transfer device can be formed in a wafer having prepared shallow trench isolation. Vertical transfer device is built as the deep trenches are formed. Using square printing to form shallow trench isolation and deep trenches, allows for scaling of the cell to very small dimensions.

2 Claims, 6 Drawing Sheets

UNITED STATES PATENT AND TRADEMARK OFFICE
CERTIFICATE OF CORRECTION

PATENT NO. : 6,184,549 B1
DATED : February 6, 2001
INVENTOR(S) : Toshiharu Furukawa It is certified that error appears in the above-identified patent and that said Letters Patent is hereby corrected as shown below:

Column 3,
Line 61, change "wordlines" to -- wordline trenches --.

Change Figure 8 to the following:

FIG.8

UNITED STATES PATENT AND TRADEMARK OFFICE
CERTIFICATE OF CORRECTION

PATENT NO. : 6,184,549 B1  Page 4 of 4
DATED : February 6, 2001
INVENTOR(S) : Toshiharu Furukawa It is certified that error appears in the above-identified patent and that said Letters Patent is hereby corrected as shown below:

Change Figure 9 to the following:

FIG.9

Signed and Sealed this

Twenty-fifth Day of December, 2001

Attest:

JAMES E. ROGAN
Attesting Officer
Director of the United States Patent and Trademark Office